United States Patent [19]

Sahara

[11] Patent Number: 5,604,404
[45] Date of Patent: Feb. 18, 1997

[54] DRIVE CIRCUIT FOR A CATHODE RAY TUBE

[75] Inventor: Hiroshi Sahara, Kanagawa, Japan

[73] Assignee: Sony Corporation, Tokyo, Japan

[21] Appl. No.: 554,799

[22] Filed: Nov. 7, 1995

Related U.S. Application Data

[63] Continuation of Ser. No. 183,334, Jan. 19, 1994, abandoned.

[30] Foreign Application Priority Data

Jan. 21, 1993 [JP] Japan ................................ 5-008306
Jan. 21, 1993 [JP] Japan ................................ 5-008313

[51] Int. Cl.$^6$ ................................................ H01J 29/06
[52] U.S. Cl. ........................ 315/8; 315/383; 330/254
[58] Field of Search ........................ 315/344, 8, 383; 330/254

[56] References Cited

U.S. PATENT DOCUMENTS 4,651,064  3/1987  Parker et al. ........................ 315/383
5,304,946  4/1994  Sano et al. ........................ 330/254

*Primary Examiner*—Robert Pascal
*Assistant Examiner*—Michael Shingleton
*Attorney, Agent, or Firm*—Jay H. Maioli

[57] ABSTRACT

A video signal is supplied from an emitter coupled differential amplifier to a first grid electrode of a cathode ray tube. A blanking pulse signal is supplied to the base of a transistor, which constitutes a constant-current source for the differential amplifier, to put the transistor into an on-state to obtain a voltage of a blanking level to apply blanking. Since the transistor is controlled by a switching control to apply blanking, a transistor of a high voltage-resisting property is not required, and the power loss is reduced. The differential amplifier operates stably and does not deteriorate the frequency characteristic or the response characteristic.

5 Claims, 6 Drawing Sheets

1

DRIVE CIRCUIT FOR A CATHODE RAY TUBE

This is a continuation of application Ser. No. 08/183,334 filed Jan. 19, 1994, now abandoned.

BACKGROUND OF THE INVENTION

1. Field of the Invention

This invention relates to a drive circuit for a cathode ray tube, and more particularly to a drive circuit for driving a cathode ray tube in response to a video signal.

2. Description of the Related Art

A flat type cathode ray tube wherein the fluorescent screen is formed in an inclined relationship at a comparatively small angle with respect to the center axis of the electron gun is conventionally known. FIG. 1 shows a drive system for such flat type cathode ray tube.

Referring to FIG. 1, the flat type cathode ray tube is generally denoted at 1 and includes a cathode electrode K, a first grid electrode G1, a second grid electrode G2 serving as an acceleration electrode, a third grid electrode G3 serving as a focusing electrode, and a fluorescent screen 2. A high voltage HV, which is obtained by rectifying a pulse voltage outputted from a flyback transformer, is applied to the fluorescent screen 2.

A directly heated electrode which operates with a low power and has a short rise time is adopted for the cathode electrode K as different from an indirectly heated electrode which is adopted in popular cathode ray tubes. A pulse voltage from the flyback transformer is supplied as a heater voltage 3 to the cathode electrode K in order to effect so-called pulse ignition.

In this instance, since a winding of the flyback transformer is connected to the cathode electrode K, the floating capacitance of the cathode electrode K increases, and where a cathode driving system wherein a video signal is applied to the cathode electrode K is adopted, the power loss of a video circuit increases. In particular, in order to enhance the frequency characteristic, the impedance of the output stage of the video circuit must necessarily be reduced so that the influence of the floating capacitance can be ignored, and to this end, an emitter follower configuration or a like configuration is adopted. However, this results in increase of the power loss of the video circuit.

Therefore, a first grid electrode driving system wherein a video signal is applied to the first grid electrode G1 which has a comparatively low floating capacitance is adopted. In particular, an NPN transistor 4 constituting a video amplifier is provided in the flat type cathode ray tube 1, and a video signal SV is supplied from a terminal 5 to the base of the transistor 4. The emitter of the transistor 4 is grounded by way of a parallel circuit of a resistor 6 and a capacitor 7, and the collector of the transistor 4 is connected to a power source terminal +B (for example, 50 V) by way of another resistor 8. A video signal obtained at a junction between the collector of the transistor 4 and the resistor 8 is applied to the first grid electrode G1 of the cathode ray tube 1 by way of a capacitor 9.

Meanwhile, a voltage source +B1 (for example, 900 V) is grounded by way of a series circuit of a variable resistor 10 for focusing, another variable resistor 11 for cutoff adjustment and a resistor 12. A voltage obtained at the movable terminal of the variable resistor 10 is applied to the third grid electrode G3 of the cathode ray tube 1 by way of a resistor 13. The movable terminal of the variable resistor 11 is grounded by way of a capacitor 14, and a voltage obtained at a junction between the movable terminal and the capacitor 14 is applied to the second grid electrode G2 of the cathode ray tube 1.

On the other hand, another voltage source +B2 (for example, 140 V) is grounded by way of a semi-fixed resistor 15 for sub-brightness adjustment, a resistor 16, a variable resistor 17 for brightness adjustment and another resistor 18 which constitutes a constant-current circuit. A voltage obtained at the movable terminal of the variable resistor 17 is applied to the cathode electrode K by way of a resistor 19.

Cutoff adjustment of the cathode ray tube 1 is performed by varying the voltages to be applied to the second grid electrode G2 and the cathode electrode K. In particular, the voltage to be applied to the second grid electrode G2 is varied by means of the variable resistor 11 to determine the cutoff voltage of the cathode ray tube 1, and the voltage to be applied to the cathode electrode K is varied by means of the semi-fixed resistor 15 to determine the sub-brightness of the cathode ray tube 1.

Since the voltage to be applied to the cathode ray tube 1 is varied by the sub-brightness adjustment performed by way of the semi-fixed resistor 15 or the brightness adjustment performed by way of the variable resistor 17 in this manner, the resistance value of the resistor 19 is set to a comparatively high value such as, for example, 100 KΩ. However, since a beam current which increases in proportion to the video signal flows into the cathode electrode K as well known in the art, the circuit impedance must be low. To this end, the cathode electrode K of the cathode ray tube 1 is grounded by way of the capacitor 20 to lower the ac impedance.

The flat type cathode ray tube 1 further includes a terminal 21 to which a horizontal blanking pulse signal HBLK is supplied and another terminal 22 to which a vertical blanking pulse signal VBLK is supplied. The terminal 21 is connected to the base of the NPN transistor 28 by way of a resistor 23 and a diode 24. The terminal 22 is connected to the base of the transistor 25 by way of another resistor 26. The base of the transistor 28 is grounded by way of a further resistor 27 and the emitter of the transistor 25 is grounded while the collector of the transistor 25 is connected to a junction between the transistor 4 and the resistor 8 by way of a still further resistor 28.

Since blanking pulse (positive pulse) signals HBLK and VBLK are supplied to the terminals 21 and 22 for horizontal and vertical blanking periods. respectively, the transistor 25 is turned on. Consequently, the voltage at the junction between the transistor 4 and the resistor 8 is reduced substantially to 0 V, and consequently, a blanking operation is performed.

In the flat type cathode ray tube described above, the voltage at the power source terminal +B is high, and consequently, the transistor 25 constituting the blanking circuit must have a high voltage-resisting property. Further, since a comparatively high current flows through the transistor 25 for an on-period of the transistor 25, the power loss increases. Further, since the blanking circuit is added as a floating capacitance for a video period which is an off-period of the transistor 25, the frequency characteristic is deteriorated. Furthermore, the flat type cathode ray tube 1 has a time constant provided by the capacitor 9 and the resistor 28 for coupling to the first grid electrode G1 and operates at a very high speed when the transistor 25 is on, but when the transistor 25 is off, since charging occurs at another time constant provided by the resistor 8 and the capacitor 9, the operation is low and the response characteristic to a video signal is deteriorated.

Further, in order to effect cutoff adjustment, the voltage to be applied to the second grid electrode G2 is varied by way of the variable resistor 11 to determine the cutoff voltage of the cathode ray tube 1, and the voltage to be applied to the cathode electrode is varied by means of the semi-fixed resistor 15 to determine the sub-brightness. Consequently, there is a problem in that the number of steps for the adjustment is great.

Further, in order to effect cutoff adjustment, the voltage to be applied to the cathode electrode K is varied, and to this end, the resistance of the resistor 19 is set to a high value. Therefore, the cathode electrode K is grounded by way of the capacitor 20 to lower the ac impedance. Consequently, there is another problem in that the number of components is great and the cost is high accordingly.

Further, in order to effect cutoff adjustment, the voltage to be applied to the second grid electrode G2 is varied, and accordingly, the resolution may possibly be deteriorated by such cutoff adjustment.

SUMMARY OF THE INVENTION

It is an object of the present invention to provide an improved drive circuit for a cathode ray tube.

It is another object of the present invention to provide a video amplification circuit which does not require a transistor of a high voltage-resisting property for a blanking circuit, minimizes the power loss of the blanking circuit and can apply blanking without having an influence on the frequency characteristic or the response characteristic.

It is a further object of the present invention to provide a flat type cathode ray tube by which the number of steps for adjustment and the number of parts can be reduced and cutoff adjustment can be performed without suffering from deterioration of the resolution.

In order to attain the objects described above, according to the present invention, there is provided a drive circuit for a cathode ray tube, which comprises a differential amplifier for supplying a video signal to a first grid electrode of the cathode ray tube, and a constant-current source for supplying a constant current to the differential amplifier to switch the differential amplifier in response to a blanking pulse signal.

Preferably, the constant-current source includes a current mirror circuit, and the drive circuit for a cathode ray tube further comprises switching control means for controlling switching of a transistor of the current mirror circuit in response to the blanking pulse signal.

In another embodiment, the drive circuit for a cathode ray tube may further comprise a switch circuit connected in parallel to the constant-current source, and switching control means for controlling switching of the switch circuit in response to the blanking pulse signal. In this instance, the switch circuit may include a series circuit formed of a diode and a transistor.

In another, the drive circuit for a cathode ray tube may further comprise means for applying fixed voltages to a cathode electrode and a second grid electrode of the cathode ray tube, and means for varying a dc voltage to be applied to the first grid electrode to effect cutoff adjustment.

In the drive circuit for a cathode ray tube, the constant-current source for the differential amplifier is controlled by switching control in response to a blanking pulse signal, and accordingly, such a transistor having a high voltage-resisting property as required for conventional drive circuits for a cathode ray tube is not required for a blanking circuit. Further, a high current does not flow for an on-period, which results in reduction of the power loss. Further, since a video amplifier circuit is constituted from the differential amplifier, the operation of the video amplifier circuit is stable, and blanking can be performed without having an influence upon the frequency characteristic or the response characteristic.

Further, cutoff adjustment can be performed merely by varying the dc voltage to be applied to the first grid electrode of the cathode ray tube, and consequently, the number of steps required for such adjustment is decreased. Meanwhile, a fixed voltage is applied to the cathode electrode of the cathode ray tube, and accordingly, a fixed voltage can be supplied from the voltage source of a low impedance. Consequently, there is no necessity of connecting a capacitor or a like element for reducing the ac impedance between the cathode electrode of the cathode ray tube and the ground, and accordingly, the number of parts can be decreased. Further, a fixed voltage is applied to the second grid electrode, and accordingly, the resolution is not possibly deteriorated by cutoff adjustment.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
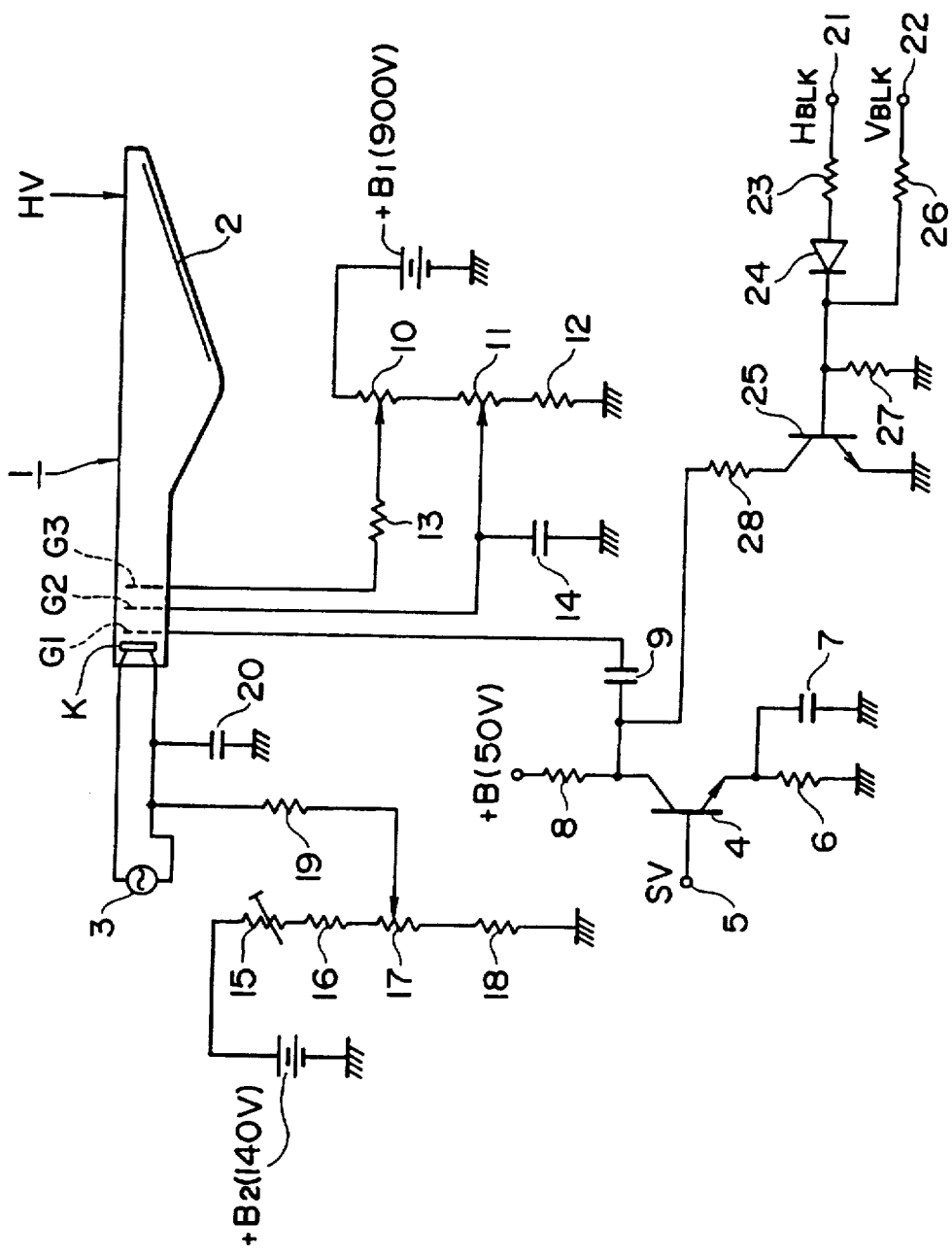
FIG. 1 is a circuit diagram showing a conventional drive circuit for a flat type cathode ray tube.
Figure 2:
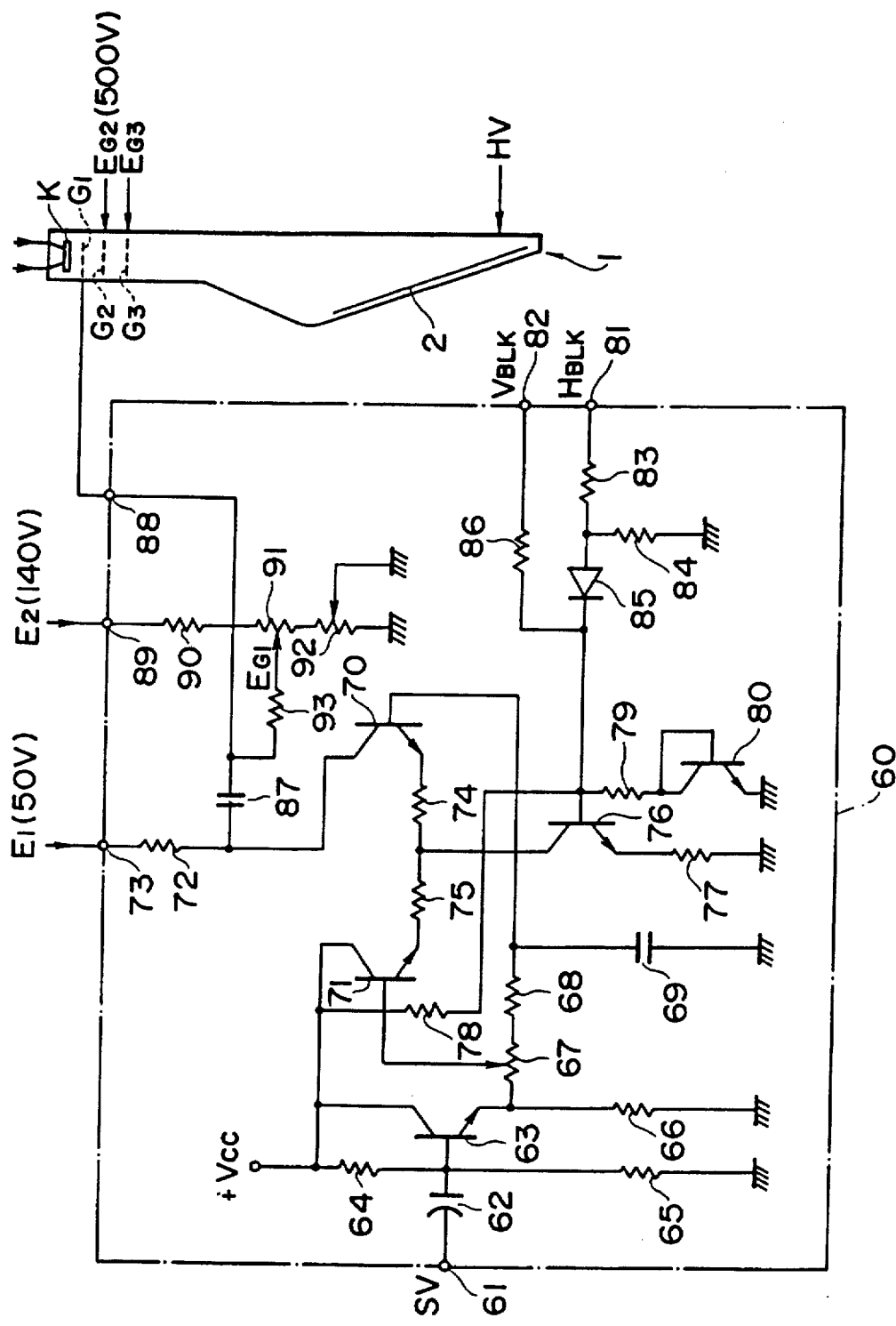
FIG. 2 is a circuit diagram of a drive circuit for a cathode ray tube showing a preferred embodiment of the present invention.
Figure 3:
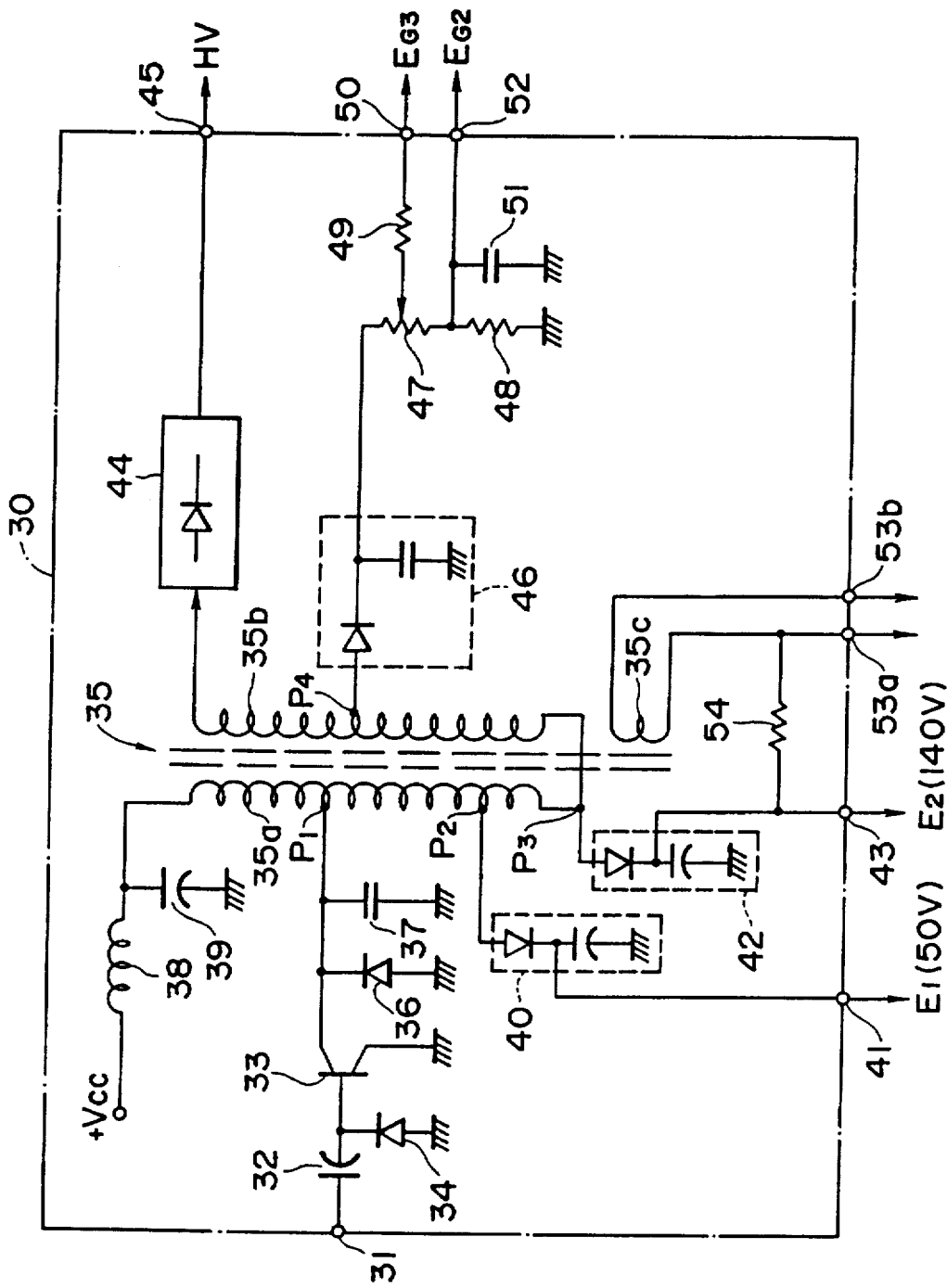
FIG. 3 is a circuit diagram showing a high voltage generation circuit for the drive circuit shown in FIG. 2.

Referring first to FIGS. 2 and 3, there is shown a drive circuit for a cathode ray tube according to a first preferred embodiment of the present invention. In FIGS. 2 and 3, like elements to those of FIG. 1 are denoted by like reference characters, and overlapping description of them is omitted herein to avoid redundancy.

First, a high voltage generation circuit 30 shown in FIG. 3 will be described. The high voltage generation circuit 30 has a terminal 31 to which a horizontal drive pulse outputted from a horizontal drive circuit (not shown) is supplied. The terminal 31 is connected to the base of an NPN transistor 33, which serves as a switching element, by way of a capacitor 32. A clamping diode 34 is connected to the base of the transistor 38.

The emitter of the transistor 33 is grounded, and the collector of the transistor 33 is connected to a centertap P1 of a primary coil 35a of a flyback transformer 35. A damper diode 36 and a resonance capacitor 37 are connected in parallel between the collector of the transistor 33 and the ground. An end of the primary coil 35a is connected to a power source terminal Vcc by way of a low-pass filter which is constituted from a coil 38 and a capacitor 39.

Another centertap P2 of the primary coil 35a of the flyback transformer 35 is connected to a rectification smoothing circuit 40. A pulse voltage obtained at the centertap P2 is rectified and smoothed by the rectification smoothing circuit 40, and a dc voltage E1 (for example, 50 V) outputted from the rectification smoothing circuit 40 is led out to a terminal 41.

The other end of the primary coil 35a of the flyback transformer 35 and a corresponding end of a secondary coil 35b of the flyback transformer 35 are connected common to each other, and a junction P3 between them is connected to the rectification smoothing circuit 42. A pulse voltage obtained at the junction P3 is rectified and smoothed by the rectification smoothing circuit 42, and a dc voltage E2 (for example, 140 V) outputted from the rectification smoothing circuit 42 is led out to a terminal 43.

The other end of the secondary coil 35b of the flyback transformer 35 is connected to a rectification circuit 44 for a voltage multiplied to a plurality 0f times. A pulse voltage obtained at the end of the secondary coil 35b is rectified by the rectifier circuit 44, and a high voltage HV outputted from the rectifier circuit 44 is led out to a terminal 45.

A centertap P4 of the secondary coil 35b of the flyback transformer 35 is connected to another rectification smoothing circuit 46. A pulse voltage obtained at the centertap P4 is rectified and smoothed by the rectification smoothing circuit 46 so that a dc voltage (for example, 900 V) is obtained. The output side of the rectification smoothing circuit 46 is grounded by way of a series circuit of a variable resistor 47 for focusing and a resistor 48. A dc voltage EG3 obtained at the movable terminal of the variable resistor 47 is led out to a terminal 50 by way of a resistor 49. A junction between the variable resistor 47 and the resistor 48 is grounded by way of a capacitor 51, and a dc voltage EG2 (for example, 500 V) obtained at the junction is led out to a terminal The opposite ends of another secondary coil 35c, which is isolated from the other coils 35a and 35b of the flyback transformer 35, are connected to terminals 53a and 53b. The secondary coil 35c is provided to obtain a pulse voltage to be applied to a cathode electrode K of a cathode ray tube 1 as hereinafter described. It is to be noted that one of the opposite ends of the secondary coil 35c is connected to the output side of the rectification smoothing circuit 42 by way of a resistor 54 having a low resistance value (for example, 100 Ω). Consequently, a fixed dc voltage is applied to the cathode electrode K of the flat type cathode ray tube 1 as hereinafter described.

Subsequently, a drive system for the flat type cathode ray tube 1 of FIG. 2 will be described. A pulse voltage led out between the terminals 53a and 53b of the high voltage generation circuit 30 described above is applied as a heater voltage to the cathode electrode K of the cathode ray tube 1, and the dc voltage E2 outputted from the rectification smoothing circuit 42 is applied to the cathode electrode K. The dc voltage EG2 led out to the terminal 52 of the high voltage generation circuit 30 described above is applied to a second grid electrode G2 of the cathode ray tube 1. The dc voltage EG3 led out to the terminal 50 of the high voltage generation circuit 30 described above is applied to a third grid electrode G3 of the cathode ray tube 1. Further, the high voltage HV led out to the terminal 45 of the high voltage generation circuit 30 described above is supplied to the cathode ray tube 1, in which it is applied to a fluorescent screen 2 and so forth.

The drive system shown in FIG. 2 further includes a CRT drive circuit 60 and has a terminal 61 to which a video signal SV is supplied. The terminal 61 is connected to the base of an NPN transistor 63 by way of a capacitor 62. A series circuit of resistors 64 and 65 is connected between a power source terminal +Vcc and the ground, and a junction between the resistors 64 and 65 is connected to the base of the transistor 63 so that a base bias is supplied to the transistor 63.

The collector of the transistor 63 is connected to the power source terminal +Vcc, and the emitter of the transistor 63 is grounded by way of a resistor 66 to construct an emitter follower configuration. A junction between the emitter of the transistor 63 and the resistor 66 is grounded by way of a series circuit of a variable resistor 67 for adjustment of the contrast, a resistor 68 and a capacitor 69, and a junction between the resistor 68 and the capacitor 69 is connected to the base of an NPN transistor 70 which constitutes an emitter coupled differential amplifier. The movable terminal of the variable resistor 67 is connected to the base of the other NPN transistor 71 which also constitutes the emitter coupled differential amplifier.

The collector of the transistor 70 is connected to a terminal 73 by way of a resistor 72. The dc voltage E1 led out to the terminal 41 of the high voltage generation circuit 30 described above is supplied to the terminal 73. The collector of the transistor 71 is connected to the power source terminal +Vcc. A series circuit of resistors 74 and 75 is connected between the emitters of the transistors 70 and 71, and a junction between the resistors 74 and 75 is grounded by way of a dc circuit of the collector-emitter of an NPN transistor 76 which constitutes a constant-current source and a resistor 77.

A series circuit of a resistor 78, another resistor 79 and an NPN transistor 80 is connected between the power source terminal +Vcc and the ground, and a junction between the resistors 78 and 79 is connected to the base of the transistor 76. The collector and the base of the transistor 80 are connected to each other to establish a diode connection, and a current mirror circuit serving as a constant-current source is constituted from the transistors 76 and 80.

The CRT drive circuit 60 further has a terminal 81 to which a horizontal blanking pulse signal HBLK (for example, a positive pulse having a pulse width of 10 to 12 μsec) is supplied, and another terminal 82 to which a vertical blanking pulse signal VBLK (for example, a positive pulse having a pulse width of 1 msec) is supplied. The terminal 81 is grounded by way of a series circuit of resistors 83 and 84, and a junction between the resistors 83 and 84 is connected to the base of the transistor 76 by way of a diode 85. Meanwhile, the terminal 82 is connected to the base of the transistor 76 by way of a resistor 86.

A junction between the collector of the transistor 70 and the resistor 72 is connected to the first grid electrode G1 of the cathode ray tube 1 by way of a capacitor 87 and a terminal 88. The dc voltage E2 led out to the terminal 43 of the high voltage generation circuit 80 described above is supplied to a terminal 89. A dc circuit of a resistor 90, a variable resistor 91 for brightness adjustment and another variable resistor 92 for cutoff adjustment is connected between the terminal 89 and the ground. For example, the resistance value of the resistor 90 is 270 KΩ, the resistance value of the variable resistor 91 is 47 KΩ, and the resistance value of the other resistor 92 is 1 MΩ. The movable terminal of the variable resistor 91 is connected to a junction between the capacitor 87 and the terminal 88 by way of a resistor 93, and the movable terminal of the variable resistor 92 is grounded.

In the drive circuit for a flat type cathode ray tube having the construction described above, the same dc voltage is supplied as a bias voltage from the emitter output of the transistor 63 to the bases of the transistors 70 and 71. Meanwhile, a video signal is supplied from the movable terminal of the variable resistor 67 to the base of the transistor 71. Consequently, an amplified video signal is obtained at the junction between the collector of the transistor 70 and the resistor 72 and the video signal is applied to the first grid electrode G1 of the cathode ray tube 1 by way of the capacitor 87. Here, the magnitude of the video signal to be supplied to the base of the transistor 71 is varied by moving the position of the movable terminal of the variable resistor 67, thereby to adjust the contrast.

Here, when the blanking pulse signal HBLK or VBLK is supplied to the terminal 81 or 82, the transistor 76 is turned on so that the collector current of the transistor 70 is increased, and consequently, a voltage of a blanking level (blanking voltage) is obtained at the junction between the collector of the transistor 70 and the resistor 72, thereby to effect a blanking operation.

Figure 4:
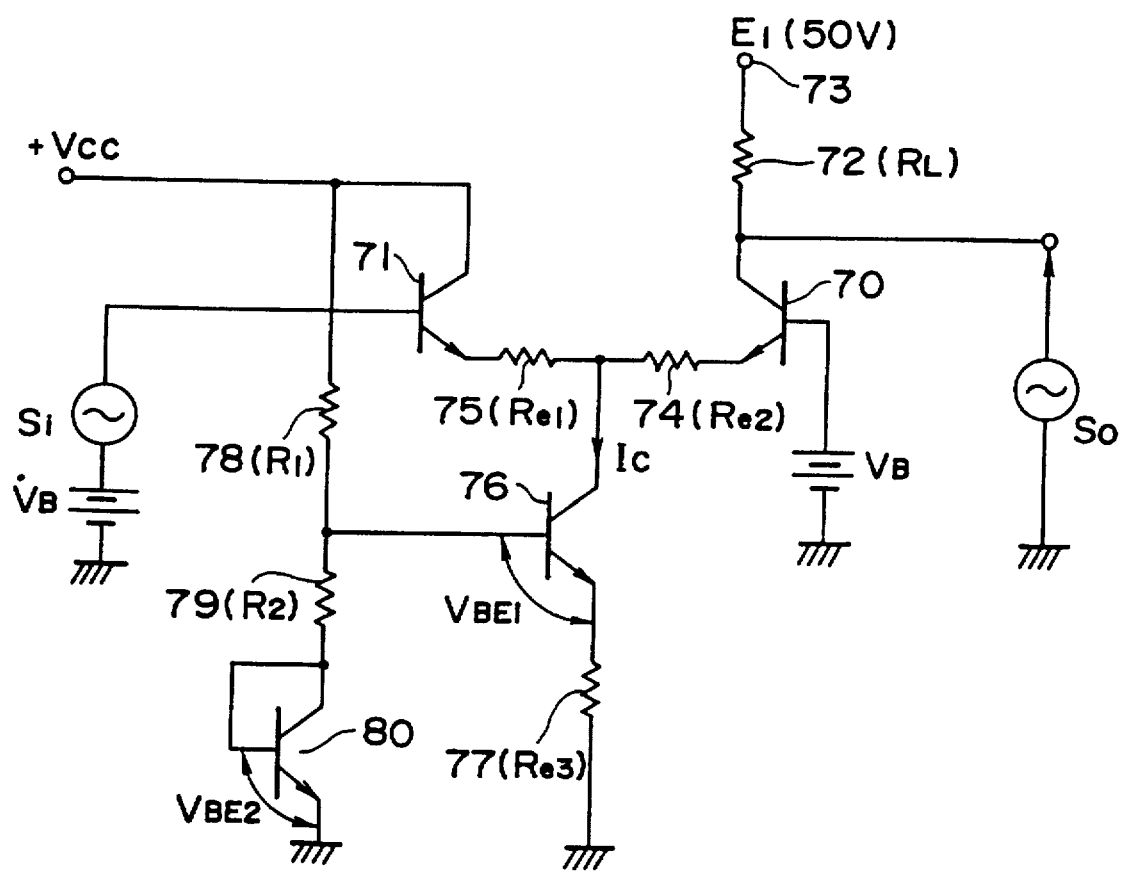
FIG. 4 is a circuit diagram showing an equivalent circuit to the drive circuit shown in FIG. 2.

FIG. 4 shows an equivalent circuit to the emitter coupled differential amplifier and associated elements of the drive system for a cathode ray tube described hereinabove with reference to FIG. 2. Referring to FIG. 4, reference character Si denotes an input video signal to be supplied to the base of the transistor 71, and So denotes an output video signal obtained at the junction between the collector of the transistor 70 and the resistor 72. Further, the base bias voltage to the transistors 70 and 71 is denoted by VB; the base-emitter voltage of the transistor 76 by $V_{BE1}$; the base-emitter voltage of the transistor 80 by $V_{BE2}$; and the resistance values of the resistors 72, 74, 75, 77, 78 and 79 are denoted by RL, Re2, Re1, Re3, R1 and R2, respectively.

Here, the collector current Ic flowing through the transistor 76 is given by the following equation (1):

$$Ic = \frac{R2}{Re3} \cdot \frac{Vcc - V_{BE2}}{R1 + R2} \quad (1)$$

where $V_{BE1} = V_{BE2}$.

Meanwhile, the gain A of the amplifier is given by the following equation (2), and the output video signal So is given by the equation (3):

$$A = \frac{R_L}{Re1 + Re2} \quad (2)$$

$$So = A \cdot Si = \frac{R_L}{Re1 + Re2} \cdot Si \quad (3)$$

In the present embodiment, the blanking pulse signal HBLK or VBLK is supplied to the base of the transistor 76, which constitutes the constant-current source for the emitter coupled differential amplifier constituted from the transistors 70 and 71, to put the transistor 76 into an on-state to obtain a voltage of a blanking level. Consequently, the blanking circuit requires no transistor having a high voltage resisting property. Further, a high current does not flow through the transistor 76 for an on-period, which reduces the power loss. In addition, the operation of the differential amplifier is so stable that blanking can be performed without having an influence on the frequency characteristic or the response characteristic.

Figure 5:
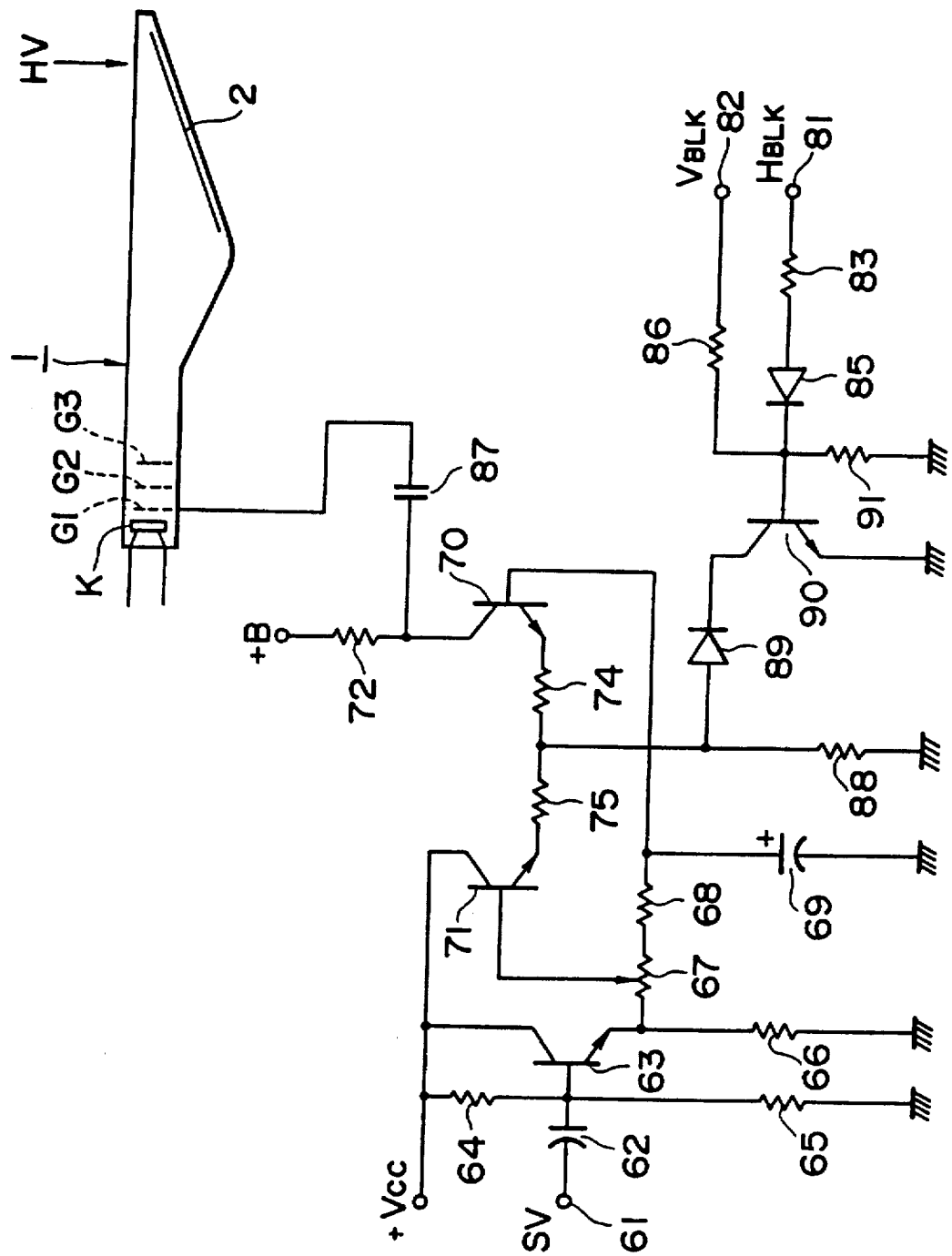
FIG. 5 is a circuit diagram of another drive circuit for a cathode ray tube showing another preferred embodiment of the present invention.

FIG. 5 shows another drive circuit for a flat type cathode ray tube according to another embodiment of the present invention. The drive circuit for a flat type cathode ray tube shown in FIG. 5 is a modification and has a similar construction to the drive circuit for a flat type cathode ray tube of the first embodiment described hereinabove with reference to FIG. 2, and like elements to those of FIG. 2 are denoted by like reference characters and overlapping description of them is omitted herein to avoid redundancy.

Referring to FIG. 5, the present drive circuit for a flat type cathode ray tube is different from the drive circuit for a flat type cathode ray tube of the preceding embodiment in the following points. In particular, the junction between the resistors 74 and 75 is grounded by way of a resistor 88 constituting a constant-current source. A series circuit of a diode 89 and the collector-emitter of an NPN transistor 90 is connected in parallel to the resistor 88. The base of the transistor 90 is grounded by way of a resistor 91. Meanwhile, the terminal 81 to which the horizontal blanking pulse signal HBLK is supplied is connected to the base of the transistor 90 by way of the resistor 83 and the diode 85, and the terminal 82 to which the vertical blanking pulse signal VBLK is supplied is connected to the base of the transistor 90 by way of the resistor 86.

In the drive circuit for a flat type cathode ray tube shown in FIG. 5, when the blanking pulse signal HBLK or VBLK is supplied to the terminal 81 or 82, the transistor 90 is put into an on-state so that the collector current of the transistor 70 is increased. Consequently, a voltage of a blanking level is obtained at the junction between the collector of the transistor 70 and the resistor 72 so that a blanking operation is performed.

Figure 6:
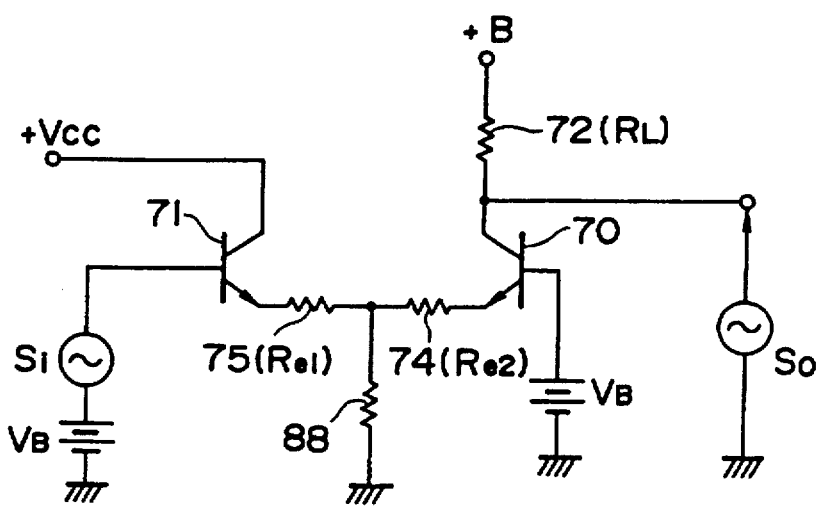
FIG. 6 is a circuit diagram showing an equivalent circuit to the drive circuit shown in FIG. 5.

FIG. 6 shows an equivalent circuit to the emitter coupled differential amplifier and associated elements of the drive circuit for a flat type cathode ray tube shown in FIG. 5. In FIG. 6, corresponding elements to those of FIG. 4 are denoted by like reference characters. It is to be noted that the diode 89 may be omitted from the drive circuit for a flat type cathode ray tube shown in FIG. 5.

In the present drive circuit for a flat type cathode ray tube, the blanking pulse signal HBLK or VBLK is supplied to the transistor 90 connected in parallel to the resistor 88, which constitutes the constant-current source for the emitter coupled differential amplifier constituted from the transistors 70 and 71, to put the transistor 90 into an on-state to obtain a voltage of a blanking level. Thus, the drive circuit for a flat type cathode ray tube exhibits similar operations and effects to those of the drive circuit for a flat type cathode ray tube of FIG. 2.

Figure 7:
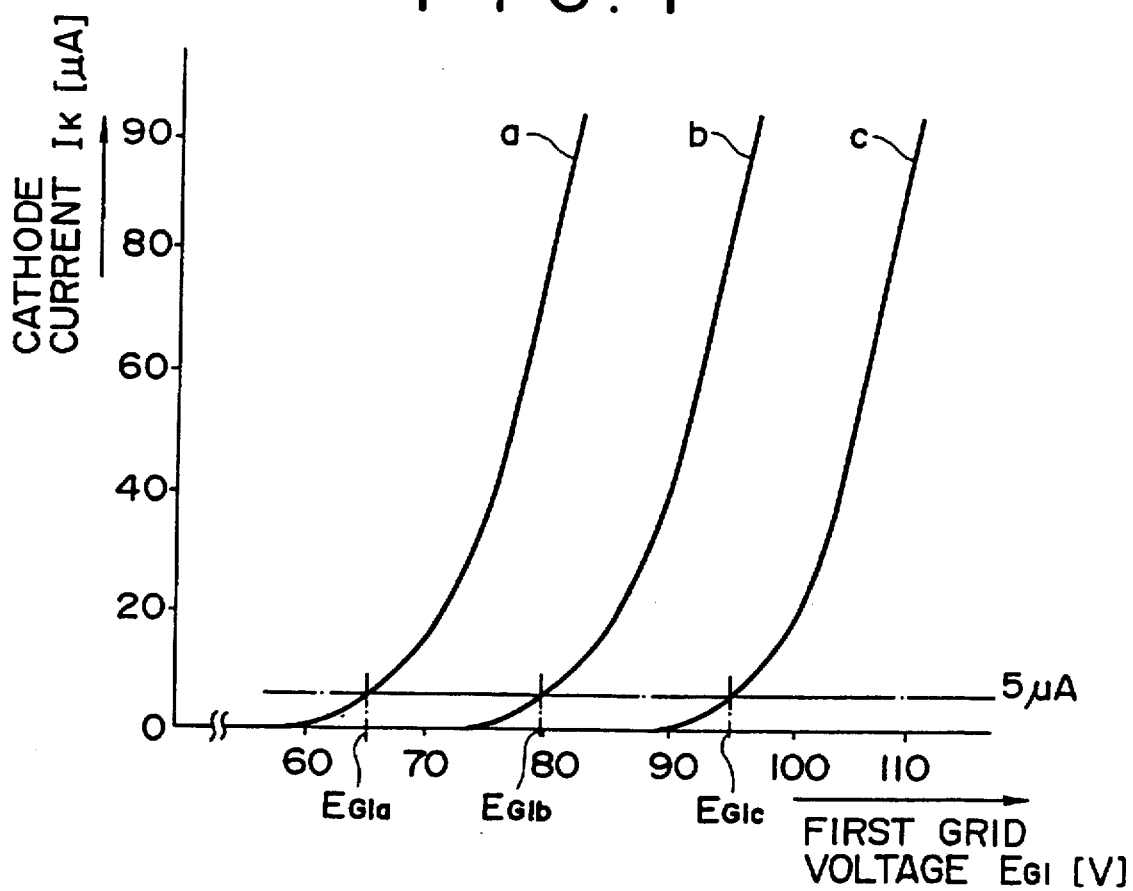
FIG. 7 is a graph showing the steady state characteristic of the flat type cathode ray tube of FIG. 5.

FIG. 7 shows the steady state characteristic of the flat type cathode ray tube 1 described hereinabove. The characteristic shown indicates the relationship of the cathode current IK to the voltage EG1 of the first grid electrode G1 when the high voltage HV is 7.5 KV, the voltage EG2 of the second grid electrode G2 is 500 V and the voltage of the cathode electrode K is 140 V. The curve a in FIG. 7 indicates the relationship where the cutoff voltage is low; the curve b indicates the relationship where the cutoff voltage is medium; and the curve c indicates the relationship where the cutoff voltage is high.

In the flat type cathode ray tube 1, since the dc voltage EG1 to be applied to the first grid electrode G1 is varied by moving the position of the movable terminal of the variable resistor 92, the cutoff voltage of the cathode ray tube 1 can be adjusted by such movement. For example, with cathode ray tubes having the characteristics of the curves a, b and c of FIG. 7, the respective cutoff levels can be set to 5 μA by adjusting the dc voltage EG1 to EG1a, EG1b and EG1c, respectively. As described hereinabove, the resistance value of the variable resistor 92 is set much higher than the resistance value of the variable resistor 91 for brightness adjustment so that it may have a greater range for adjustment. The cutoff adjustment is performed, for example, upon shipment from the factory.

In this manner, in the drive circuit for a flat type cathode ray tube of the present embodiment, cutoff adjustment can be performed merely by varying the dc voltage EG1 to be applied to the first grid electrode G1, and the number of steps required for adjustment can be decreased and the adjustment is simplified comparing with conventional drive circuits for a flat type cathode ray tube wherein such cutoff adjustment is performed by varying the dc voltages to be applied to the second grid electrode G2 and the cathode electrode K.

Meanwhile, the dc voltage to be applied to the cathode ray tube K is the dc voltage E2 outputted from the rectification smoothing circuit 42, and a fixed voltage can be supplied from the voltage source of a low impedance. Accordingly, there is no need for connecting a capacitor or the like for reducing the ac impedance between the cathode electrode K and the ground as in conventional drive circuits for a flat type cathode ray tube. Consequently, the number of parts can be reduced.

Further, the fixed dc current EG2 is applied to the second grid electrode G2. Accordingly, the voltage to be applied to the second grid electrode G2 is not varied by cutoff adjustment as in conventional drive circuits for a flat type cathode ray tube, and consequently, there is no possibility that the resolution may be deteriorated by such cutoff adjustment.

Having now fully described the invention, it will be apparent to one of ordinary skill in the art that many changes and modifications can be made thereto without departing from the spirit and scope of the invention as set forth herein.

What is claimed is:

1. A drive circuit for a flat cathode ray tube having a cathode electrode, a first grid electrode and a second grid electrode, comprising:

a high-voltage generator receiving horizontal drive pulses for generating a first fixed DC voltage supplied to said cathode electrode, a fixed voltage supplied to said second grid electrode of said cathode ray tube, a high voltage supplied to said cathode ray tube, and a second fixed DC voltage;

a differential amplifier for supplying a video signal for producing a video display on said cathode ray tube;

means connected to said high-voltage generator and to said differential amplifier for combining said second fixed DC voltage and said video signal and for adjusting said second fixed DC voltage to effect cutoff adjustment and to supply a combined DC voltage and video signal to said first grid electrode of said cathode ray tube, said cutoff adjustment and said fixed voltage supplied to said second grid electrode being mutually independent; and a constant-current source for supplying a constant current to said differential amplifier and for switching said differential amplifier to blank said video signal according to a blanking pulse signal, wherein said high-voltage generator includes a secondary coil that operates independently from said differential amplifier to produce a pulsed voltage, said cathode electrode being energized by said first fixed DC voltage and also by said pulsed voltage.

2. A drive circuit for a cathode ray tube according to claim 1, wherein said constant-current source includes a current mirror circuit, and switching control means for controlling switching of a transistor of said current mirror circuit according to said blanking pulse signal.

3. A drive circuit for a flat cathode ray tube having a cathode electrode, a first grid electrode and a second grid electrode, comprising:

means for applying a first fixed DC voltage to said cathode electrode, a fixed voltage to said second grid electrode, and a high voltage to said cathode ray tube;

a differential amplifier for supplying a video signal;

means for combining a second DC voltage and said video signal supplied by said differential amplifier, for varying said second DC voltage to effect cutoff adjustment, and for supplying a combined DC voltage and video signal to said first grid electrode of said cathode ray tube, said cutoff adjustment and said fixed voltage applied to said second grid electrode being mutually independent;

a constant-current source for supplying a constant current to said differential amplifier;

a switch circuit connected in parallel to said constant-current source for switching said differential amplifier; and switching control means for controlling switching of said differential amplifier by said switch circuit to blank said video signal according to a blanking pulse signal, wherein said means for applying includes a secondary coil that operates independently from said differential amplifier to produce a pulsed voltage, said cathode electrode being energized by said first fixed DC voltage and also by said pulsed voltage.

4. A drive circuit for a cathode ray tube according to claim 3, wherein said switch circuit includes a diode in series with a transistor.

5. A drive circuit for a cathode ray tube according to claim 3, wherein said fixed voltage applied to said second grid electrode is a fixed DC high voltage, said cutoff adjustment and said fixed DC high voltage supplied to said second grid electrode being mutually independent.

* * * * *